(12) United States Patent
Collins et al.

(10) Patent No.: US 9,161,428 B2
(45) Date of Patent: Oct. 13, 2015

(54) INDEPENDENT CONTROL OF RF PHASES OF SEPARATE COILS OF AN INDUCTIVELY COUPLED PLASMA REACTOR

(71) Applicant: APPLIED MATERIALS, INC., Santa Clara, CA (US)

(72) Inventors: Kenneth S. Collins, San Jose, CA (US); Satoru Kobayashi, Santa Clara, CA (US); Lawrence Wong, Fremont, CA (US); Jonathan Liu, Sunnyvale, CA (US); Yang Yang, Sunnyvale, CA (US); Kartik Ramaswamy, San Jose, CA (US); Shahid Rauf, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 356 days.

(21) Appl. No.: 13/804,616

(22) Filed: Mar. 14, 2013

(65) Prior Publication Data

US 2013/0284370 A1 Oct. 31, 2013

Related U.S. Application Data

(60) Provisional application No. 61/638,876, filed on Apr. 26, 2012.

(51) Int. Cl.
*H05H 1/46* (2006.01)
*H01J 37/32* (2006.01)

(52) U.S. Cl.
CPC ............... *H05H 1/46* (2013.01); *H01J 37/321* (2013.01); *H01J 37/32174* (2013.01); *H05H 2001/4682* (2013.01)

(58) Field of Classification Search
CPC .............. H05H 2001/4682; H05H 1/46; H01J 37/32082; H01J 37/32174; H01J 37/32137; H01J 37/32146; H01J 37/32155; H01J 37/321
See application file for complete search history.

(56) References Cited

U.S. PATENT DOCUMENTS

| | | | |
|---|---|---|---|
| 5,116,482 A | 5/1992 | Setoyama et al. | |
| 5,314,603 A | 5/1994 | Sugiyama et al. | |
| 5,573,595 A | 11/1996 | Dible | |
| 5,810,963 A | 9/1998 | Tomioka | |
| 5,824,606 A | 10/1998 | Dible et al. | |
| 5,844,369 A | 12/1998 | Yoshizako et al. | |
| 5,907,221 A | 5/1999 | Sato et al. | |
| 5,971,591 A | 10/1999 | Vona et al. | |
| 6,214,162 B1 | 4/2001 | Koshimizu | |
| 6,788,736 B1 | 9/2004 | Kawama et al. | |
| 8,729,932 B2 | 5/2014 | Chiesa | |
| 2002/0014402 A1 | 2/2002 | Nagamine et al. | |
| 2002/0185227 A1 | 12/2002 | MacGearailt | |
| 2003/0111180 A1 | 6/2003 | Nagahata et al. | |
| 2004/0050495 A1 | 3/2004 | Sumiya et al. | |

(Continued)

OTHER PUBLICATIONS

Official Action Dated Apr. 7, 2015 Issued in Related U.S. Appl. No. 13/632,302.

(Continued)

*Primary Examiner* — Jeffrie R Lund
*Assistant Examiner* — Yuechuan Yu
(74) *Attorney, Agent, or Firm* — Robert M. Wallace

(57) ABSTRACT

Plasma distribution is controlled in a plasma reactor by controlling the phase differences between different RF coil antennas, in accordance with a desired or user-selected phase difference, by a phase-lock feedback control loop.

17 Claims, 12 Drawing Sheets

(56) References Cited

U.S. PATENT DOCUMENTS

| | | |
|---|---|---|
| 2007/0114945 A1 | 5/2007 | Mattaboni et al. |
| 2010/0224321 A1 | 9/2010 | Grimbergen et al. |
| 2011/0192349 A1 | 8/2011 | Hammond, IV et al. |
| 2011/0240222 A1 | 10/2011 | Sawada et al. |
| 2012/0086464 A1 | 4/2012 | Hanawa et al. |
| 2012/0139586 A1 | 6/2012 | Dayi et al. |
| 2012/0212135 A1 | 8/2012 | Suzuki |

OTHER PUBLICATIONS

U.S. Appl. No. 14/174,511, filed Feb. 6, 2014, Kobayashi et al.
U.S. Appl. No. 13/632,302, filed Oct. 1, 2012, Kobayashi et al.

INDEPENDENT CONTROL OF RF PHASES OF SEPARATE COILS OF AN INDUCTIVELY COUPLED PLASMA REACTOR

CROSS-REFERENCE TO RELATED APPLICATIONS

This application claims the benefit of U.S. Provisional Application Ser. No. 61/638,876 filed Apr. 26, 2012 entitled INDEPENDENT CONTROL OF RF PHASES OF SEPARATE COILS OF AN INDUCTIVELY COUPLED PLASMA REACTOR, by Kenneth S. Collins, et al.

BACKGROUND OF THE INVENTION

Plasma processing of a workplace in the fabrication of integrated circuits, plasma displays, solar panels or the like requires uniform treatment of the workpiece across its surface. For example, in plasma processing of semiconductor wafers, feature sizes are on the order of nanometers, and uniformity and control of plasma ion distribution density across the workpiece surface is critical. Uniformity of distribution of etch rate or deposition rate across the surface of workpiece is required, as workpiece size (e.g., semiconductor wafer diameter) is increasing, and feature sizes are decreasing. Non-uniformity in plasma processing can arise from non-uniformities or asymmetries in the reactor chamber electrical characteristics, non-uniformity in the distribution of process gases and flow rates, or non-uniformity in the application of RF power, for example. It is necessary to correct or compensate for such non-uniformities .

SUMMARY

A plasma reactor for processing a workplace includes a vacuum chamber, a workplace support pedestal in the chamber having a workplace support surface, and plural coil antennas. Plural RF power generators are coupled to respective ones of the plural coil antennas, one of the plural RF generators being a reference RF generator. A clock signal source is coupled to the reference RF power generator, and respective phase shifters are coupled between the clock signal source and at least respective ones of the RF power generators other than the reference RF generator, each phase shifter having a phase shifter control input. Plural RF sensor probes area coupled or adjacent respective ones of the plural RF coil antennas. Respective phase detectors are provided, each having a phase detector output and a respective pair of phase detector inputs, one of the phase detector inputs being coupled to a respective ones of the plural RF sensor probes other than the RF sensor probe, the other one of the phase detector inputs of each of the plural RF sensor probes being coupled to the RE sensor probe corresponding to the reference RF coil antenna. A user interface has respective user interface outputs defining a user-selected phase difference between the reference RF coil antenna and a respective one of the remaining RF sensor probes. A feedback controller stage is coupled to (a) respective ones of the phase detector outputs and (b) respective ones of the user interface outputs, the feedback controller stage further comprising respective controller outputs coupled to respective ones of the phase shifter control inputs. The feedback controller stage may be either a single feedback controller or a pair of feedback controllers coupled to the outputs of respective ones of the phase detectors.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1A:
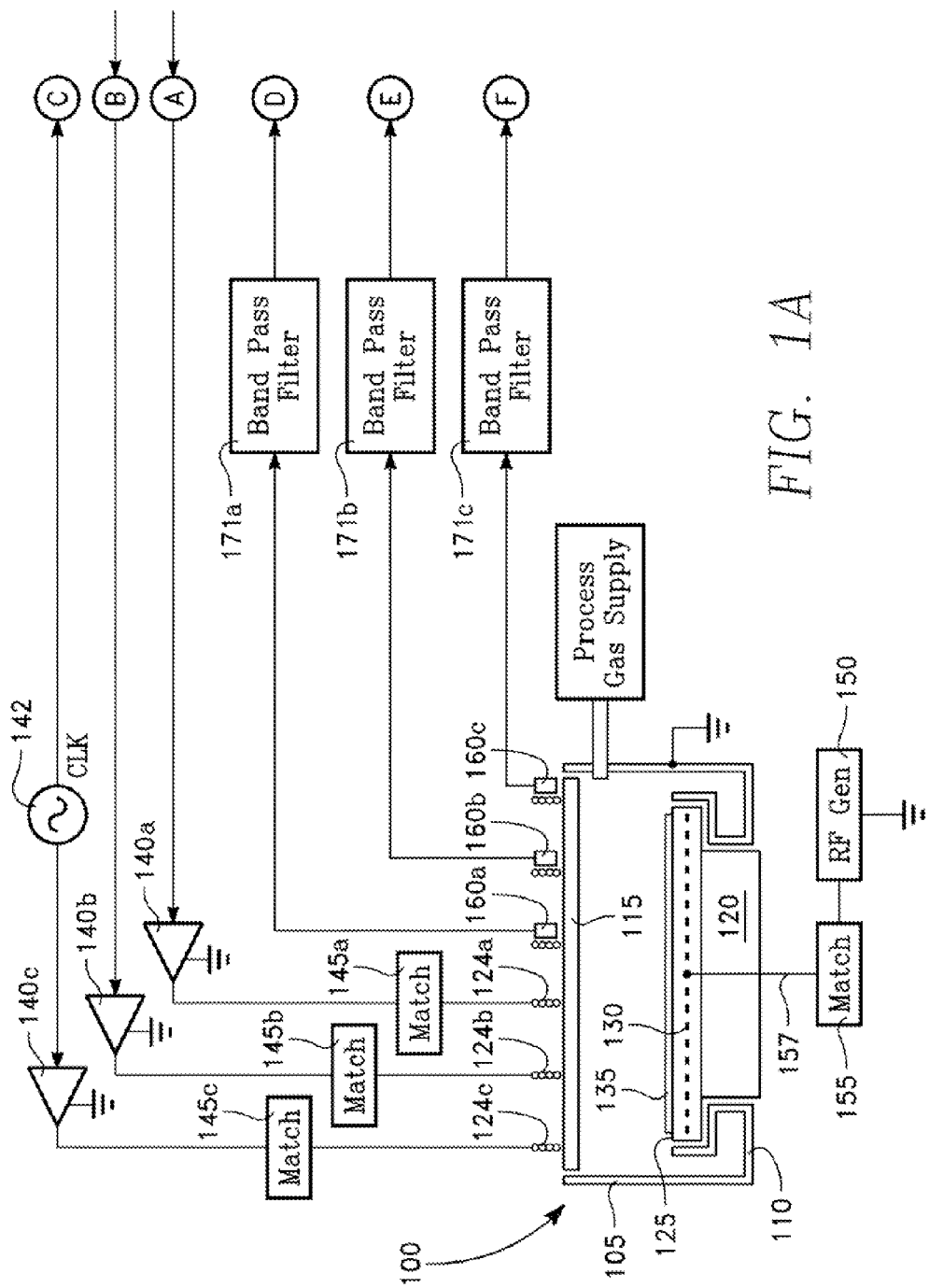
FIGS. 1A, 1B and 1C constitute a schematic block diagram of a first embodiment of a plasma reactor for controlling radial distribution of plasma ions, by the phase differences between RF power applied to different coil antennas.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

The plasma reactor described herein provides control of radial distribution of plasma ion density by controlling the phase difference between RF source power waveforms applied to different RF coil antennas. In the described embodiments, the RF coil antennas are concentric coils overlying a ceiling of the chamber of the plasma reactor, The RF power distribution at the surface of the workpiece affects plasma ion density, which in turn affects process rate distribution. The process may be an etch process or a deposition process, for example.

In general, RF power of the same frequency is applied to the three RF coil antennas. Radial distribution of plasmas ion density is controlled by controlling the phase differences between the RF power waveforms applied to the three RF coil antennas. Non-uniformity in plasma ion distribution causes non-uniformity in etch rate distribution or deposition rate distribution across the treated surface of the workpiece or wafer. Different non-uniformities in etch or deposition rate may be reduced by selecting different phase differences among the three RF power waveforms applied to the three RF coil antenna. Controlling the phase differences amount the RF coil antennas may be employed to reduce any observed non-uniformity in radial distribution of process rate on the treated surface of the workpiece. While the foregoing description refers to controlling RF power waveforms applied to three RF coil antennas, there may be more than three RF coil antennas among which the phase differences may be adjusted.

Measuring the phase differences between the different RF coil antennas is most easily done taking measurements at the RF power generator outputs to the three RF coil antennas. Such a measurement is typically inaccurate, because there is an RF impedance match circuit in the path to each RF coil antenna, which distorts the measurement.

One problem is that it is difficult to control the phase difference manually when the process recipe requires fast adjustment of the phase difference. The problem may foe addressed by providing a feedback control loop responsive to a selection of the desired phase difference at a user interface. However, we have discovered that such a feedback control loop can be unreliable or unstable when responding to a phase difference between RF power waveforms of high frequency. Other sources of instability can lead to "dead-zones" in a 0° to 360° phase angle range, in which the feedback control loop cannot reach or hold a phase angle within the dead-zone. These problems are addressed in embodiments described below.

Figure 1B:
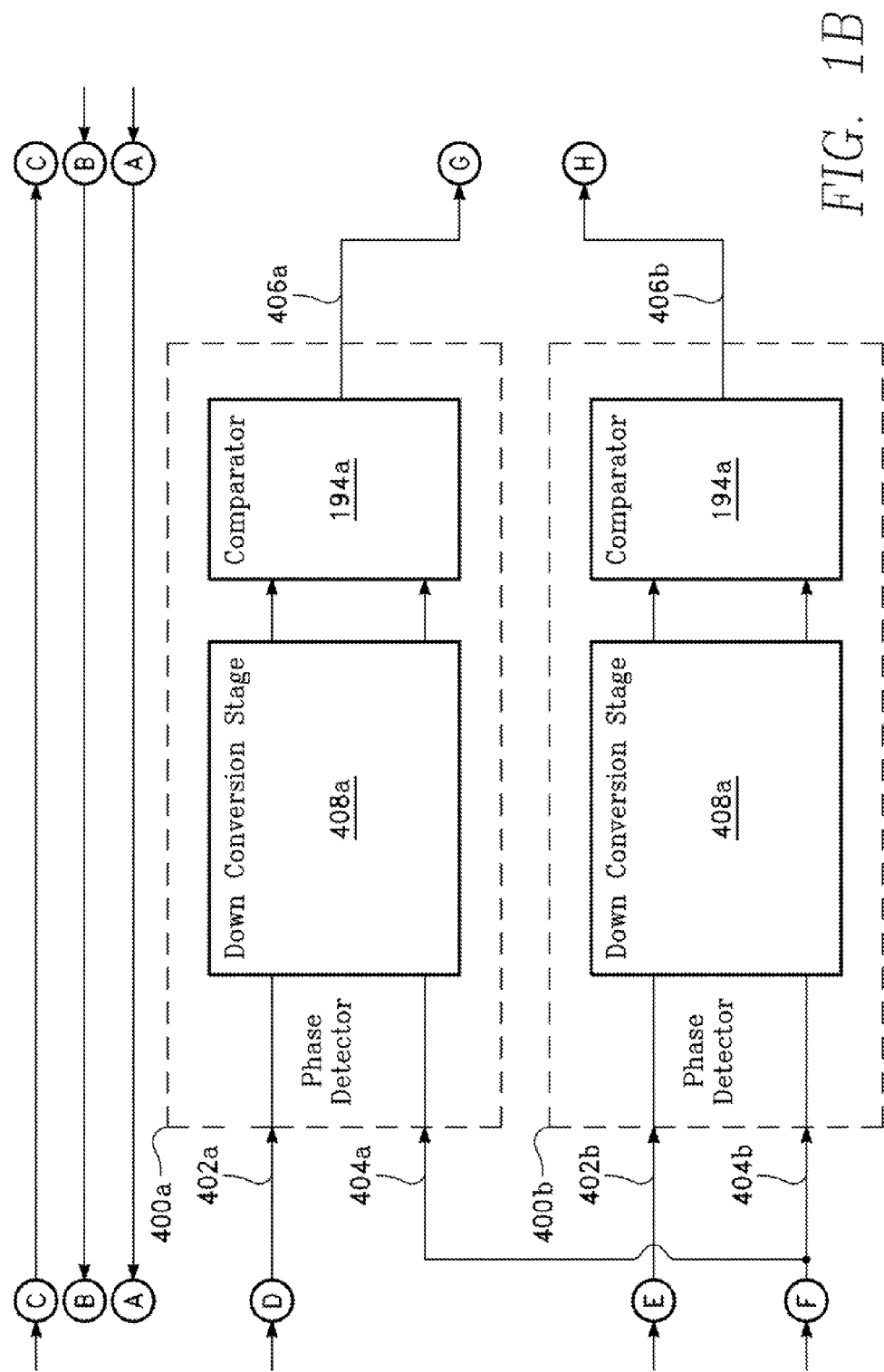
Figure 1C:
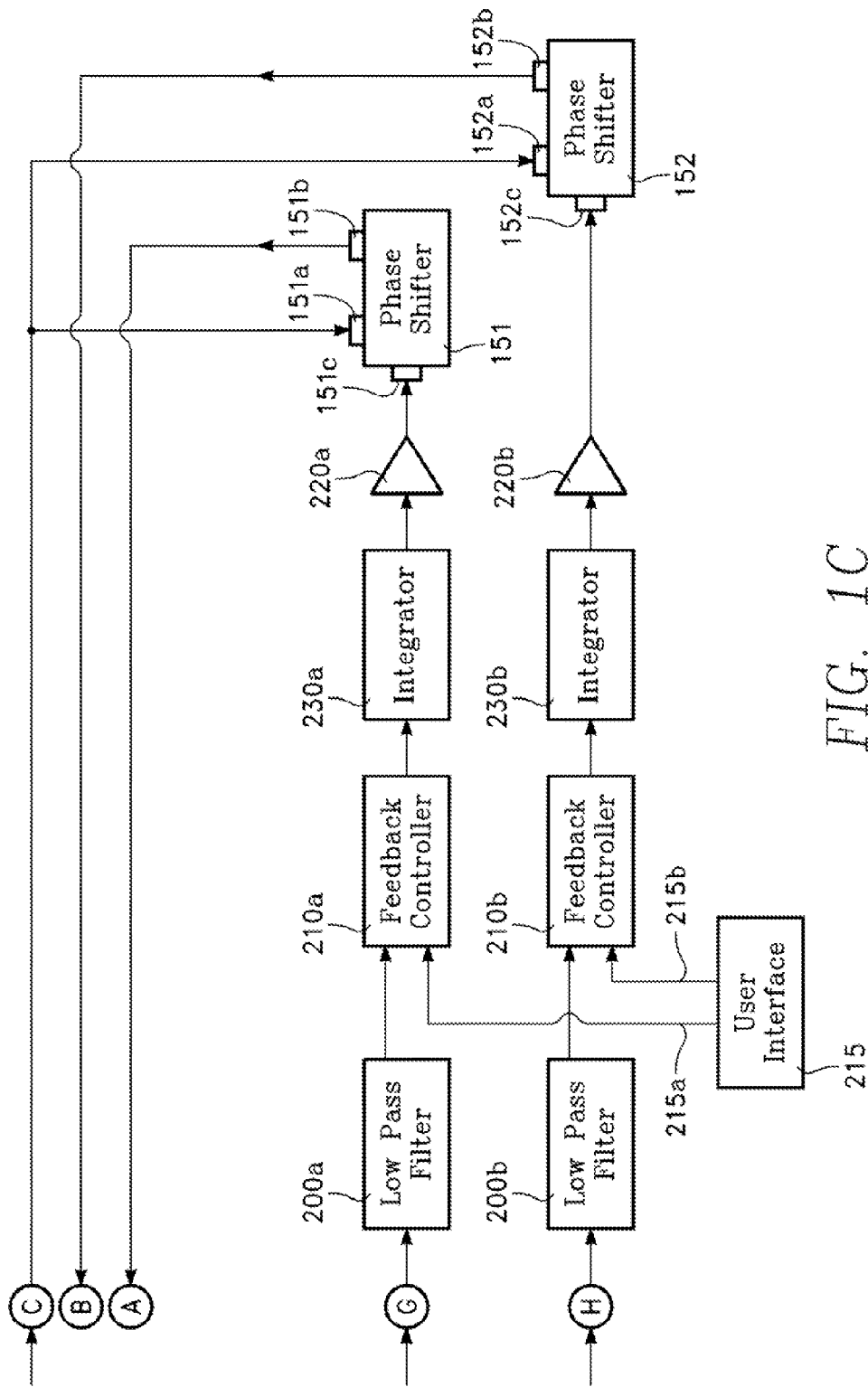
Figure 1D:
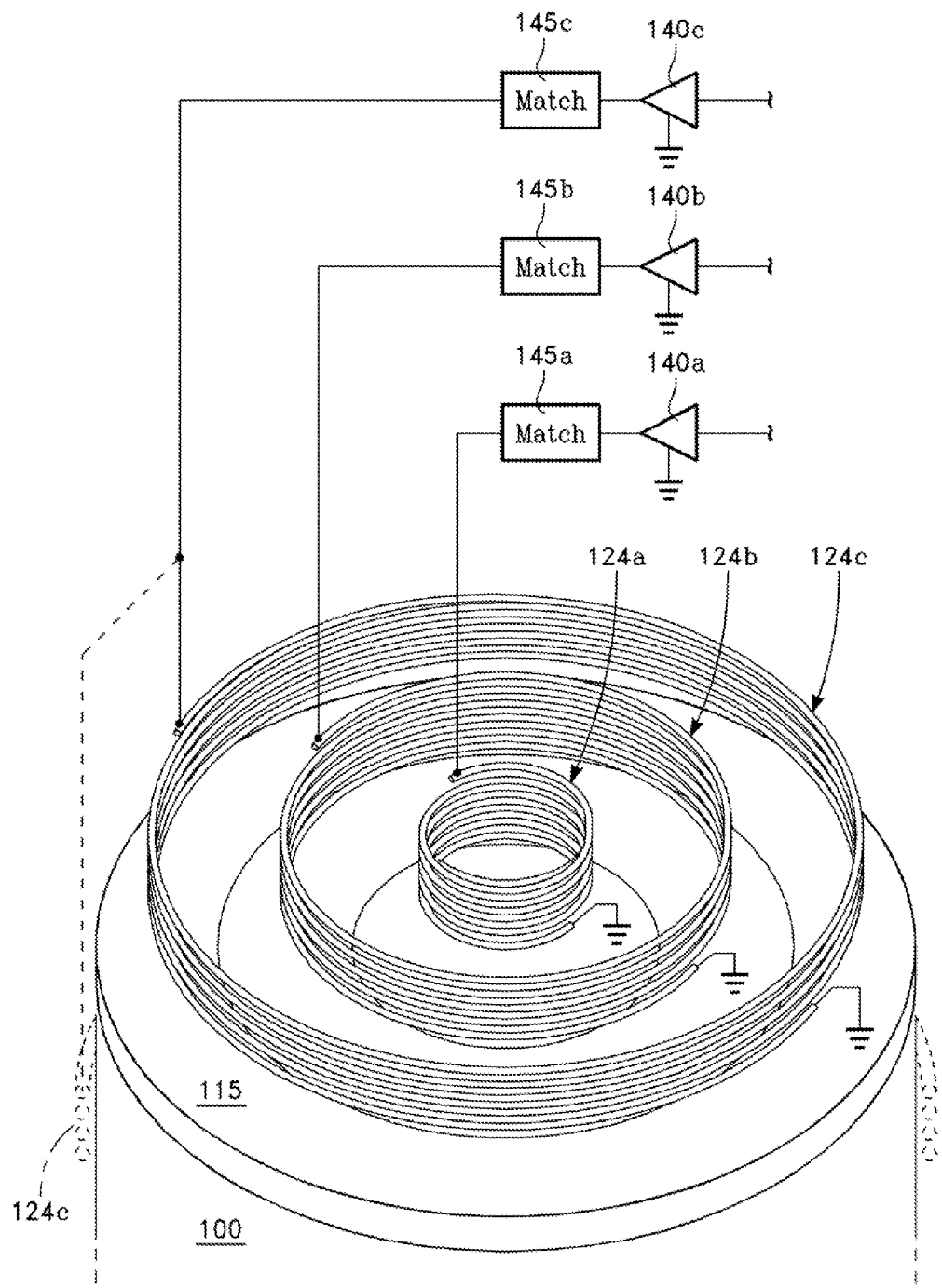
FIGS. 1D, 1E and 1F depict alternative configurations of an overhead inductively coupled RF coil antenna.
Figure 1E:
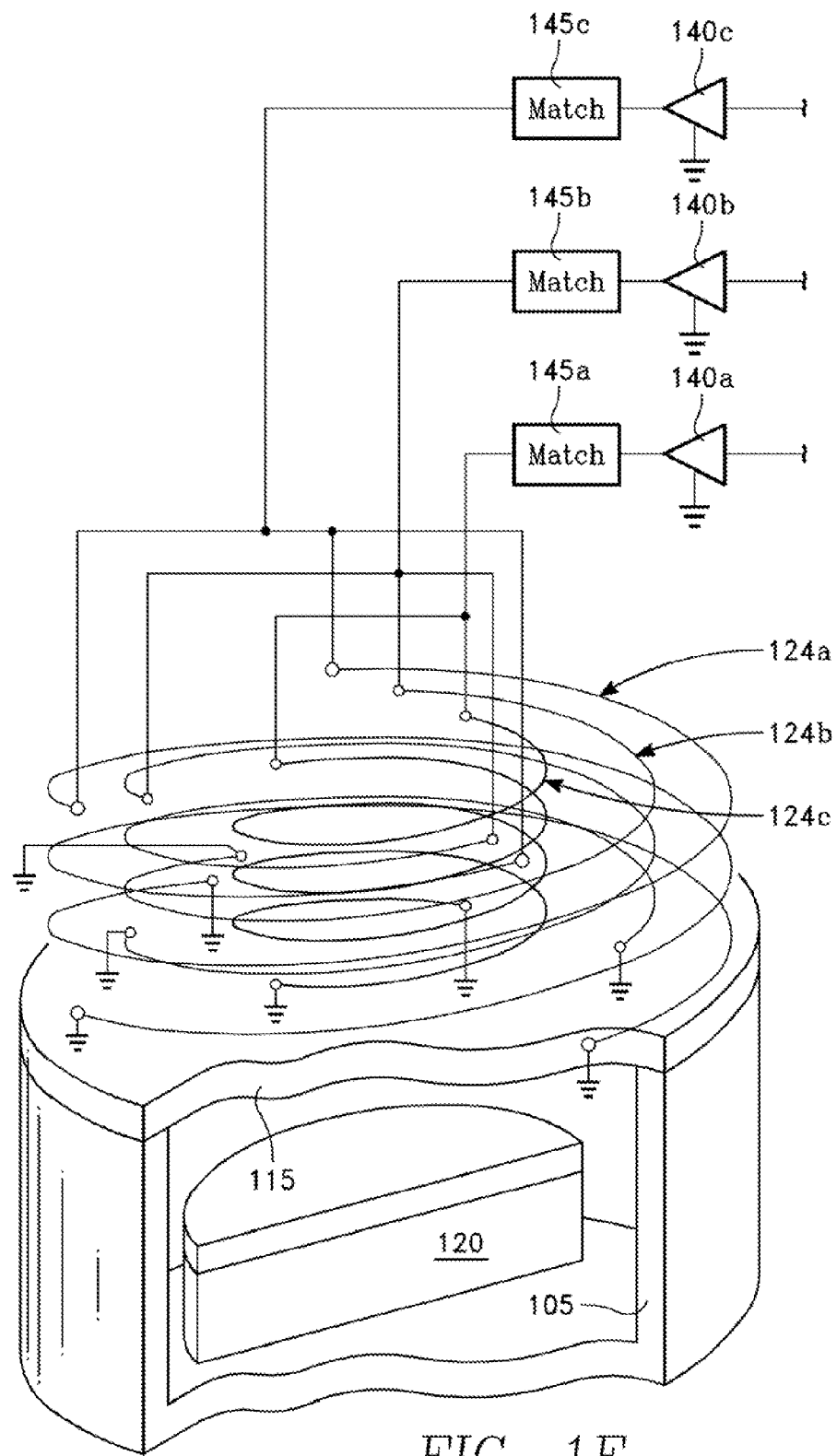
Figure 1F:
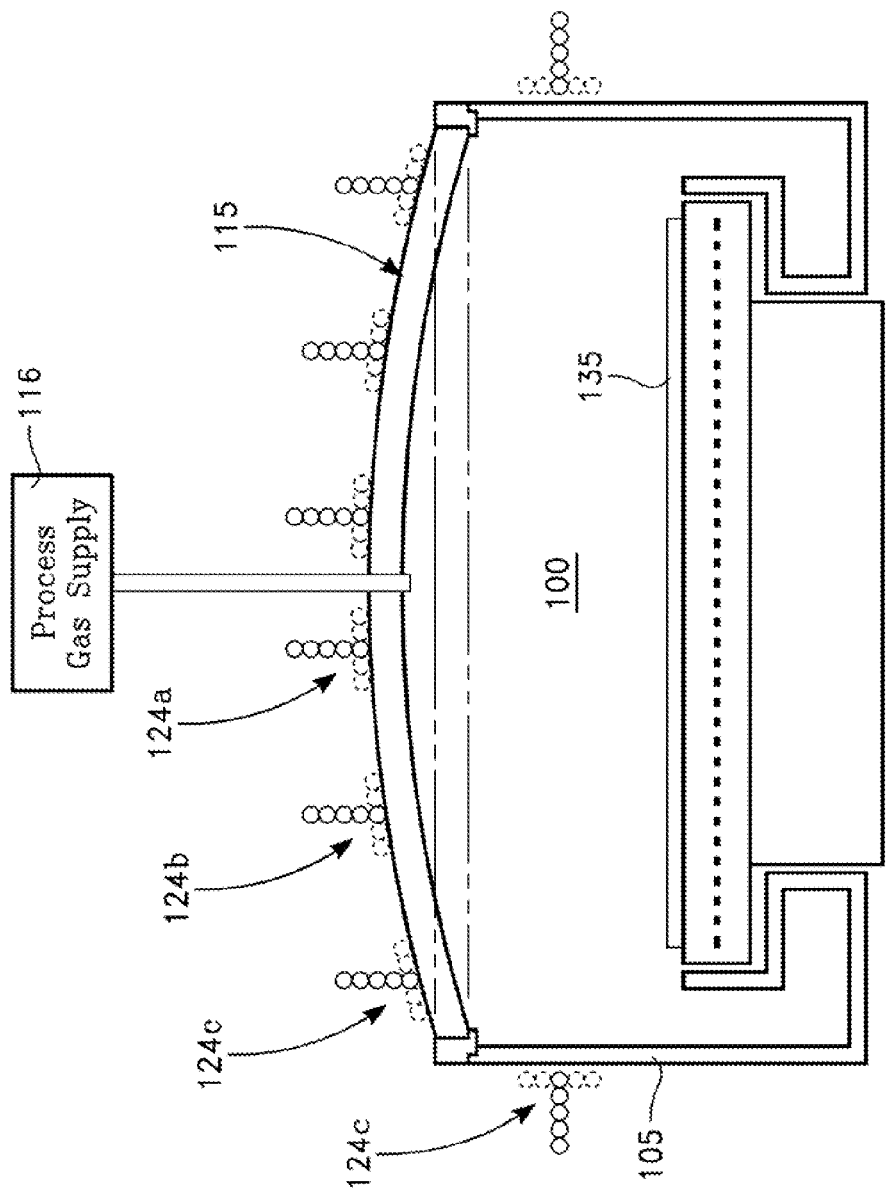

Referring to FIGS. 1A, 1B and 1C, a plasma reactor includes vacuum chamber enclosure 100 that includes a cylindrical, side wall 105, a floor 110, and a ceiling 115. Three concentric RF coil antennas 124a, 124b and 124c overlie the ceiling 115. As shown in FIG. 1D, each one of the coil antennas may be formed, as single conductor wound in a cylindrical helix. Alternatively, as shown in FIG. 1E, each individual one of the coil antennas 124a, 124b, 124c may be an interleaved coil of plural (e.g., two or three) parallel windings axially fed in a symmetrical manner. In the example of FIG. 1E, each one of the outer coil 124c and the intermediate coil 124b consists of three windings with their feed points (terminations) separated by 120 degree intervals, while the inner coil 124a. consists of two windings with their feed points separated by 180 degrees. The feed points are the conductor terminations farthest above the ceiling, while the conductor terminations nearest the ceiling are grounded. As indicated in phantom line in FIG. 1D, the outer coil 124e may be located or wrapped around the side wall and below the height of the ceiling. Moreover, the ceiling may be dome-shaped, so that different portions of the coils are located at different heights above the workpiece. As shown in FIG. 1F, one or ail of the coils 124a, 124b and/or 124c may be flat or "pancake" coils.

The ceiling 115 may be formed of a dielectric, non-conductive or semiconductive material. A pedestal 120 extends through the floor 110 and holds a workpiece support 125 including a workpiece support electrode 130 underlying a workpiece support surface and facing the ceiling 115.

A workpiece such as semiconductor wafer 135 may be held on the support surface of the workpiece support 125. Hot shown in the drawings are gas injection and gas distribution apparatus of the reactor chamber 100, an exhaust port in the floor 110 and a vacuum pump coupled to the exhaust port. A bias RF power generator 150 may be provided and coupled through a bottom RF impedance match circuit 155 to the workpiece support electrode 130 by a bottom coaxial feed 157.

Figure 1G:
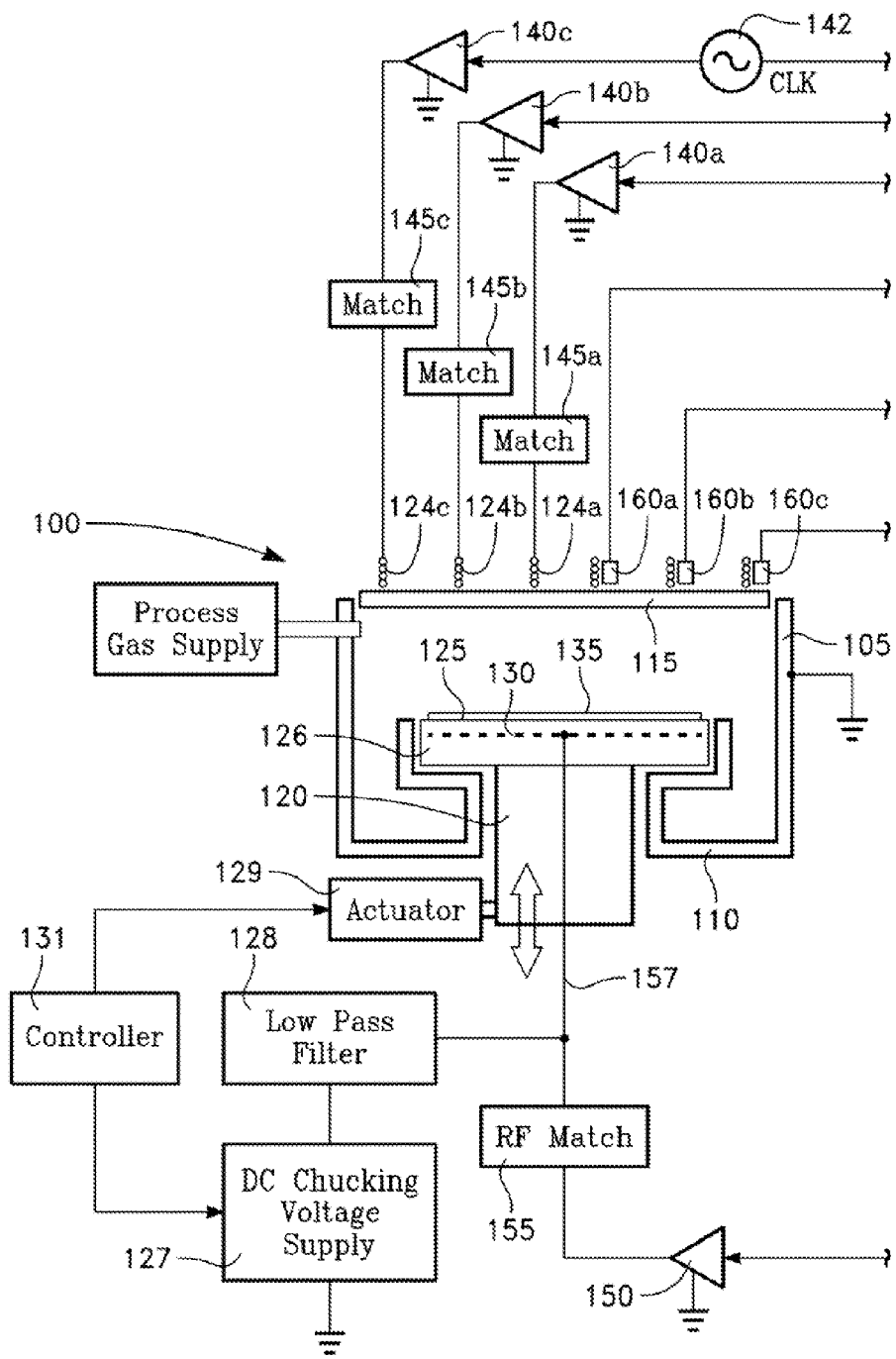
FIG. 1G is an enlarged view of a portion of FIG. 1A.

As shown in the enlarged view of FIG. 1G, the workpiece support 125 embodies an electrostatic chuck, including an insulating puck 126 in which the electrode 130 is embedded. A D.C. chucking voltage supply 127 is connected through a low pass isolation filter 128 to the electrode 130, The electrode 130 functions as an electrostatic chucking electrode as well as an electrode through which RF bias power from the RF generator 150 is coupled to the plasma. The workpiece support 125 is may be raised toward the ceiling electrode 115 or depressed away from the ceiling electrode so as to controllably vary the workpiece-to-ceiling gap. For this purpose, an actuator 129 coupled to the workpiece support raises and depresses the workpiece support 125. A process controller 131 may govern the actuator 129 and the D.C. voltage supply 127.

Three RF power amplifiers 140a, 140b and 140c are coupled through respective RF impedance match circuits 145a, 145b and 145c to the respective RF coil antennas 124a, 124b and 124c. One of the three RF power amplifiers is selected as the "reference" RF power amplifier, to which the phases of the other two RF power amplifiers are referenced. In the embodiment of FIGS. 1A, 1B and 1C, the reference RF power amplifier is the BP power amplifier 140c coupled to the outermost RF coil antenna 124c. The reference RF power amplifier 140c is synchronized directly with a clock generator 142.

The RF power amplifiers 140a, 140b and 140c produce the same fixed frequency, Fgen, which may be 13.56 MHz in one example. The RF power amplifiers 140a and 140b are separately synchronized with the clock 142 through respective controllable phase shifters 151 and 152, The phase shifter 151 receives the signal from the clock 142 at its input port 151a and provides at its output port 151b a first phase-shifted version of the output of the clock 142. The amount by which the signal at the output port 151b is phase-shifted from the signal at the input port 151a is determined by the phase shifter 151 in accordance with a control signal applied to its control input 151c.

In similar manner, the phase shifter 152 receives the signal from the clock 142 at its input port 152a and provides at its output port 152b a second phase-shifted version of the output of the clock 142. The amount by which the signal at the output port 152b is phase-shifted from the signal at the input port 152a is determined by the phase shifter 152 in accordance with a control signal applied to its control input 152c. The first and second phase-shifted versions of the clock signal determine the phases of the RF power amplifiers 140a, 140b relative to the reference RF power amplifier 140c.

The term "phase shifter" as used in this specification includes any suitable device capable of shifting phase of an RF or oscillator signal in response to a control signal. Such a device may be a passive or active device, and may be implemented with passive variable reactance elements or active RF circuits or digital circuits, for example.

Three RF sensor probes 160a, 160b and 160c are placed near or adjacent (or on) the three RF coil antennas 124a, 124b and 124c, respectively. Each RF sensor probe 160a, 160b and 160c may be a sensor probe or other suitable probe, such as a voltage probe, and may be of the type disclosed in related U.S. Patent Application Publication No. US-2012-0086464-A1 published Apr. 12, 2012 entitled IN-SITU VHP VOLTAGE/CURRENT SEtiSORS FOR A PLASMA REACTOR, by Hiroji Hanawa, et al. Placement of the sensor probes 160a-160c at each of the RF coil antennas 124a-124c in this manner provides accurate measurement of phase, without distortion by the RF impedance matches 145a-145c.

Bandpass filters 171a, 171b and 171c remove noise (such as noise attributable to plasma sheath harmonics) from the signals output by the sensor probes 160a, 160b and 160c, respectively.

The filtered RF signals from the sensor probe 160a (corresponding to the inner RF coil antenna) and the sensor probe 160c (corresponding to the outer RF coil antenna 124c) are applied to a pair of inputs 402a and 404a of a first phase detector 400a. The filtered RF signals from the sensor probe 160b (corresponding to the middle RF coil antenna 124b) and the sensor probe 160c (corresponding to the outer EF coil antenna 124c) are applied to a pair of inputs 402b and 404b of a second phase detector 400b. The first phase detector 400a produces an output signal at its output 406a representing the measured phase between the inner and outer coil antennas 124a and 124c. The second phase detector 400b produces an output signal at its output 406b representing the measured phase between the middle RF coil antenna 124b and the outer RF coil antenna 124c. Each phase detector 400a and 400b may be of the same structure. One embodiment of the first phase detector 400a is now described with reference to FIG. 2.

Figure 2:
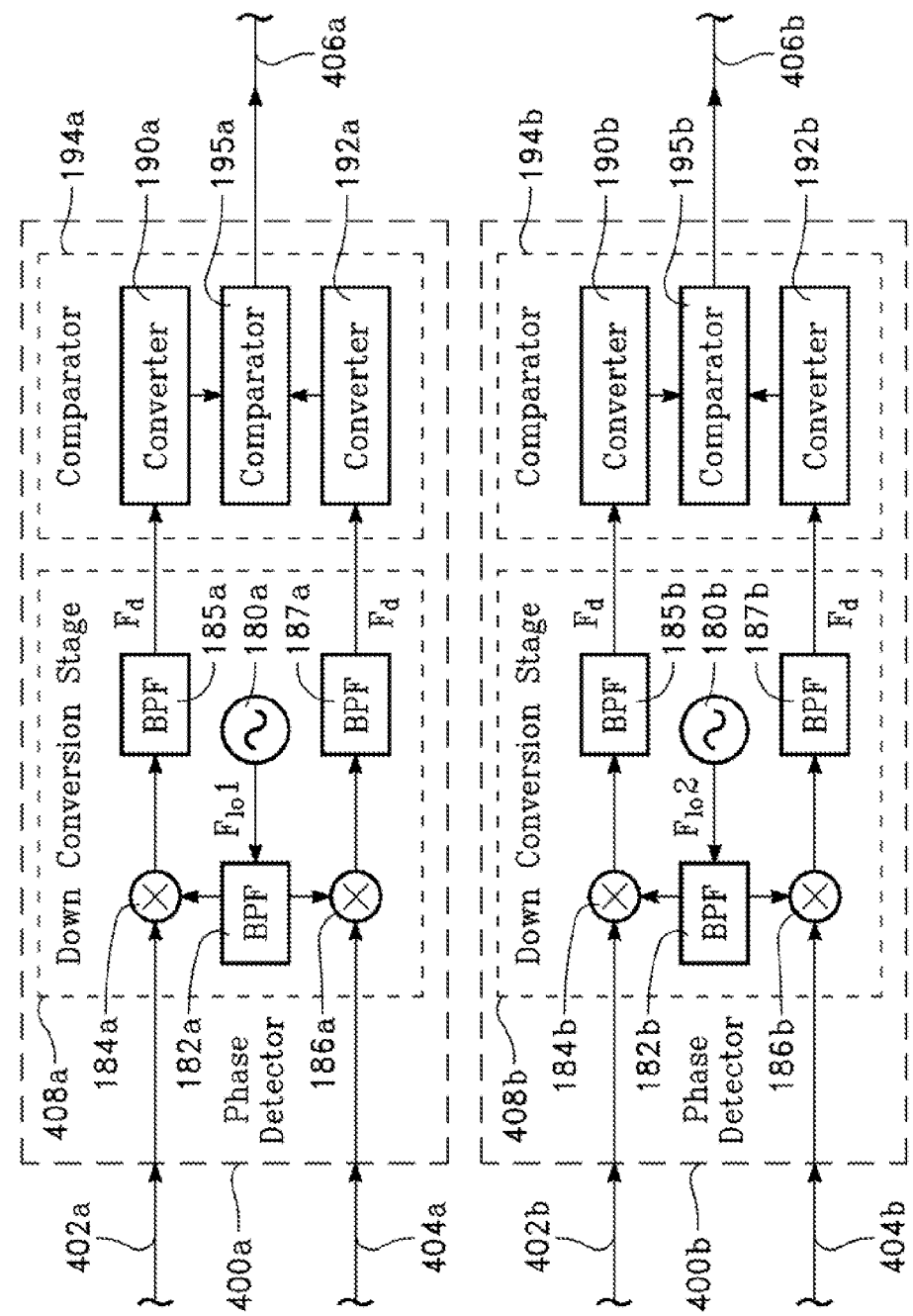
FIG. 2 is a schematic block diagrams of phase detectors employed in the embodiment of FIGS. 1A, 1B and 1C.

Referring now to FIG. 2, the first phase detector 400a may include an optional frequency down conversion stage 408a. The down conversion stage 408a includes a crystal-controlled local oscillator 180a having an output frequency Flo1 which differs from the RF power generator frequency Fgen by a difference frequency Fd. A bandpass filter 182a centered at Flo1 filters the output of the local oscillator 180a. The down conversion stage 408a also includes first and second mixers 184a and 186a. The first mixer 184a combines the signal received from the first input port '102a with the output of the local oscillator 180a to produce a first modulated signal. A band pass filter 185a extracts the lower sideband (the difference frequency Fd) from the first modulated signal. A second mixer 186a combines the signal received from the second input port 404a with the output of the local oscillator 180a to produce a second modulated signal. A band pass filter 187a extracts the lower sideband (the difference frequency Fd) from the second modulated signal.

The outputs of the down conversion stage 408a represent outputs of the RF sensor probes 160a and 160c that have been down-converted in frequency (i.e., from Fgen to Fd). The RF power generator frequency Fgen may be an HF frequency, while the down-converted frequency Fd may be in the medium frequency (MF) or low frequency CLE) band, for example. The down conversion stage 408a may not be required in some applications, and may be eliminated if desired.

In a phase comparator 194a, the down-converted RF probe outputs are converted to respective square wave signals by respective sine wave-to-square wave converters 190a and 192a. The phase comparator 194a further includes a phase-lock-loop (PLL) phase comparator 195a which measures the phase difference between the signals produced by the pair of sine wave-to-square wave converters 190a and 192a. The phase comparator 194a produces a phase difference signal at the phase detector output 406a representing a measured phase angle between the signals derived from the RF probes 160a and 160c received at the phase detector inputs 402a and 404a.

The structure of the second phase detector 400b is now described with reference to FIG. 2. The second phase detector 400b may include an optional frequency down conversion stage 408b including a crystal-controlled local oscillator 180b having an output frequency Flo2 which differs from the RF power generator frequency Fgen by a difference frequency Fd. A bandpass filter 182b centered at Flo2 filters the output of the local oscillator 180b. The down conversion stage 408b further includes first and second mixers 184b and 186b. The first mixer 184b combines the signal received from the first input port 402b with the output of the local-oscillator 180b to produce a first modulated signal. A first band pass filter 185b extracts the lower sideband (the difference frequency Fd) from the first modulated signal. The second mixer 186b combines the signal received from the second input port 404b with the output of the local oscillator 180b to produce a second modulated signal. A band pass filter 187b extracts the lower sideband, (the difference frequency Fd) from the second modulated signal.

The outputs of the down conversion stage 408b represent outputs of the RF sensor probes 160b and 160c that have been down-converted in frequency (i.e., from Fgen to Fd). The down conversion stage 408b may not be required in some applications, and may be dispensed with if desired. The phase detector 400b further includes a phase comparator 194b in which down-converted RF probe outputs are converted to respective square wave signals by respective sine wave-to-square wave converters 190b and 192b. The phase comparator 194b further includes a phase lock loop (PLL) phase comparator 195b which measures the phase difference between the signals produced by the pair of sine wave-to-square wave converters 190b and 192b. The phase comparator 194b produces a phase difference signal representing a measured phase angle between the pair of RF probe outputs received at the phase detector inputs 402b and 404b.

Referring again to FIGS. 1A, 1B and 1C, a first low pass filter 200a filters the phase difference signal from the output 406a of the first phase detector 400a, and functions as a feedback loop filter. A first feedback controller 210a, which may be implemented as a microprocessor, senses a difference between the phase difference signal from the low pass filter 200a and a first user-selected phase difference. The first user-selected phase difference is the desired phase difference between the inner and outer RF coil antennas 160a and 160c chosen by the user, and may be furnished to the feedback controller 210a from a first user interface output 215a of a user interface 215. The user interface 215 may be implemented, for example, as a personal computer or other device having a keyboard or touch-sensitive screen or similar input device.

Similarly, a second low pass filter 200b filters the phase difference signal from the output 406b of the second phase detector 400b, and functions as a feedback loop filter. A second feedback controller 210b, which may be implemented as a microprocessor, senses a difference between the phase difference signal from the second low pass filter 200b and a second user-selected phase difference from a second user interface output 215b of the user interface 215. The second user-selected phase difference is the desired phase difference between the middle and outer RF coil antennas 160b and 160c chosen by the user. The first and second user-selected phase differences may be selected through the user interface independently of each other.

Each feedback controller 210a and 210b produces a signal representing an error or difference between the user-selected phase difference (from the respective user interface output 215a and 215b) and the measured phase difference (from the respective phase detector 400a and 400b). Each error signal is applied as corrective (negative) feedback to the control input of the respective phase shifter 151, 152. For example, if the first measured phase difference detected by the phase detector 400a. is greater than the first user-selected phase difference, then the error signal is applied to the control input 151c of the first phase shifter 151 so as to decrease the phase difference established by the phase shifter 151. Similarly, if the measured phase difference is less than the user-selected phase difference, then the error signal is applied to the control input 151c of the phase shifter 151 so as to increase the phase difference established by the phase shifter 151.

The range of the voltage at the phase shifter control input required to swing each phase shifter 151r 152 through a range of phase angles (e.g., 0° through 360°) may differ from the voltage range produced by each feedback controller 210a, 210b for the corresponding range. Therefore, operational amplifiers 220a and 220b may be employed at the outputs of the respective feedback controllers 210a and 210b to provide the appropriate shifts in voltage range.

The system of FIGS. 1A, 1B and 1C embodies a feedback control system with two independent feedback loops. In each different loop, the measured phase difference between a respective pair of the three RF coil antennas 160a-160c (e.g., the first pair 160a, 160c and the second pair 160b, 160c) is compared to a user-selected phase difference for that respective pair, by the respective feedback controller 210a or 210b. Each comparison defines an error. Based upon that error, each of the feedback controllers 210a, 210b provides a negative feedback or error signal to the respective phase shifter 151, 152. Each phase comparator 195a, 195b and each feedback controller 210a, 210b operates in synchronism with a clock (e.g., the clock 142) in successive iterations. Each iteration results in an updated error signal from each feedback controller 210a, 210b, resulting in a succession of error signals applied to the respective phase shifter control input 151c, 152c.

Respective integrators 230a and 230b may be provided at the outputs of the respective feedback controllers 210a and 210b. Each integrator 230a, 230b may be implemented as a memory storing the last n error signals VO where the index i ranges from 1 (the current iteration) to n (the oldest iteration). The number n may lie in a range of integers from 5 to 100 or 1000 or more, for example. Each integrator 230a, 230b computes the average over the last n error signals and outputs this average as the feedback control signal to the phase shifter control input 151c or 152c. This averaging process improves the stability of each feedback control loop.

The frequency down-conversion provided by the down conversion stages 408a and 408b in the phase detectors 400a and 400b reduces the frequency of the signals processed by the feedback control loop to within a range or capability of each phase comparator 195a, 195b. This improves the performance and stability of each feedback control loop.

Figure 3:
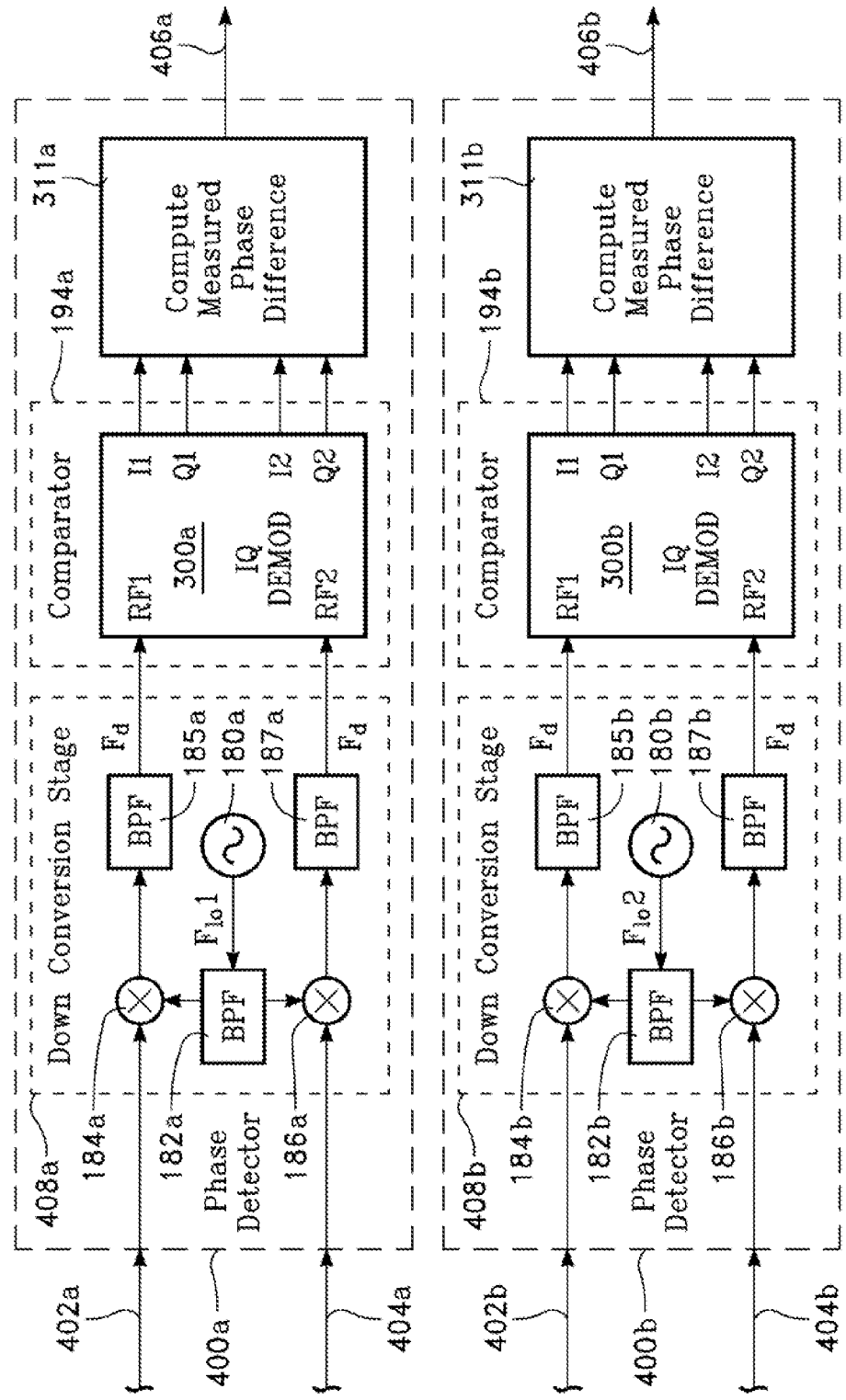
FIG. 3 is a schematic block diagram of a modification of the embodiment of FIGS. 1A, 1B and 1C employing I-Q demodulators phase comparators.

The rate at which each feedback controller 210a, 210b produces the succession of error signals is determined by the sampling rate r at which each controller 210a, 210b samples the output of the respective phase detector 400a, 400b. Stability of the feedback loop over a complete range of values (e.g., 0°-360°)of the user-selected phase difference is enhanced by establishing the sampling rate r to be sufficiently great so that the time between samples T=1/r is less than the settling time, t, of the impedance matches 145a, 145b, 145c, preferably by a factor of 10, or 100 or 1000, for example. The impedance match settling time, t, is the time required for the impedance match to complete a change in impedance in response to a sensed change in load impedance on the RF generator, and is principally a function of the speed of stepper motors (not shown in the drawing) controlling unillustrated variable capacitors in the impedance matches 145a, 145b and 145c. For example, the settling time, t, may be measured using a variable RF load connected to the output of the impedance match, making a discrete change in the impedance of the RF load, and observing the amount of time required for the impedance match to stabilize following the change, FIG. 3 depicts a modification of the phase detectors 400a, 400b of FIG. 2, in which the PLL phase comparators 195a, 195b are replaced by I-Q demodulators 300a, 300b respectively. (The PLL phase comparators 195a, 195b and the IQ demodulators 300a, 300b are herein referred to generically as phase comparators.) Each IQ demodulator 300a, 300b has a pair of RF inputs, RF1 and RF2, connected to the outputs of the band pass filters 185a, 187a and 185b, 187b, respectively. Each I-Q demodulator 300a, 300b has four outputs, namely an in-phase output I1 and a quadrature output Q1 derived from the input RF1, and an in-phase output I2 and a quadrature output Q2 derived from the input RF2. If $\theta_1$ is the phase of the signal at RF1 and $\theta_2$ is the phase of the signal at RF2, then I1 represents $\cos\theta_1$, Q1 represents $\sin\theta_1$, I2 represents $\cos\theta_2$, and Q2 represents $\sin\theta_2$. For each IQ demodulator 300a, 300b, a phase difference ($\theta_1-\theta_2$) can be computed from the four outputs of the individual IQ demodulator. Respective processors 311a and 311b are provided at the output of the respective IQ demodulators 300a and 300b. Each processor 311a, 311b is adapted to compute the measured phase difference from the four IQ output signals I1, Q1, I2 and Q2 of the respective IQ demodulator. The measured phase difference is provided to an input of a respective one of a pair of feedback controllers 210a, 210b. Each feedback controller 210a, 210b computes an error between the measured phase difference and a respective user-selected phase difference furnished by the user interface 215, and produces a corrective feedback control signal based upon the computed, error.

The frequency down-conversion provided by the down conversion stages 408a and 408b reduces the frequency of the signals processed by the IQ demodulators 300a and 30b down to a value within the range or capability of the IQ demodulators, and promotes stability of each feedback control loop.

Figure 4A:
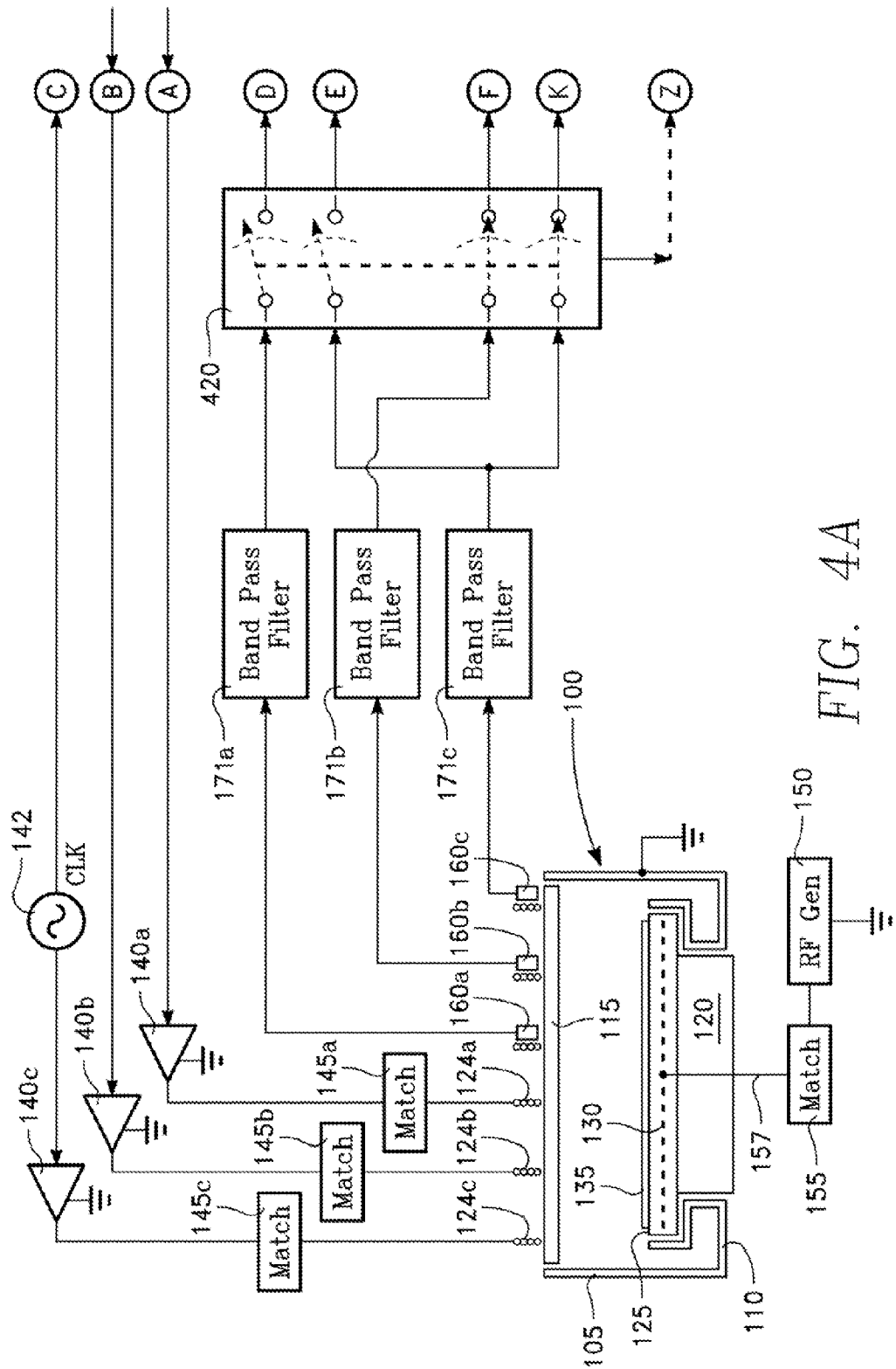
FIGS. 4A, 4B and 4C constitute a schematic block diagram of a modification of the embodiment of FIGS. 1A, 1B and 1C, in which a single feedback controller is shared between two independent feedback control loops using multiplexing.
Figure 4B:
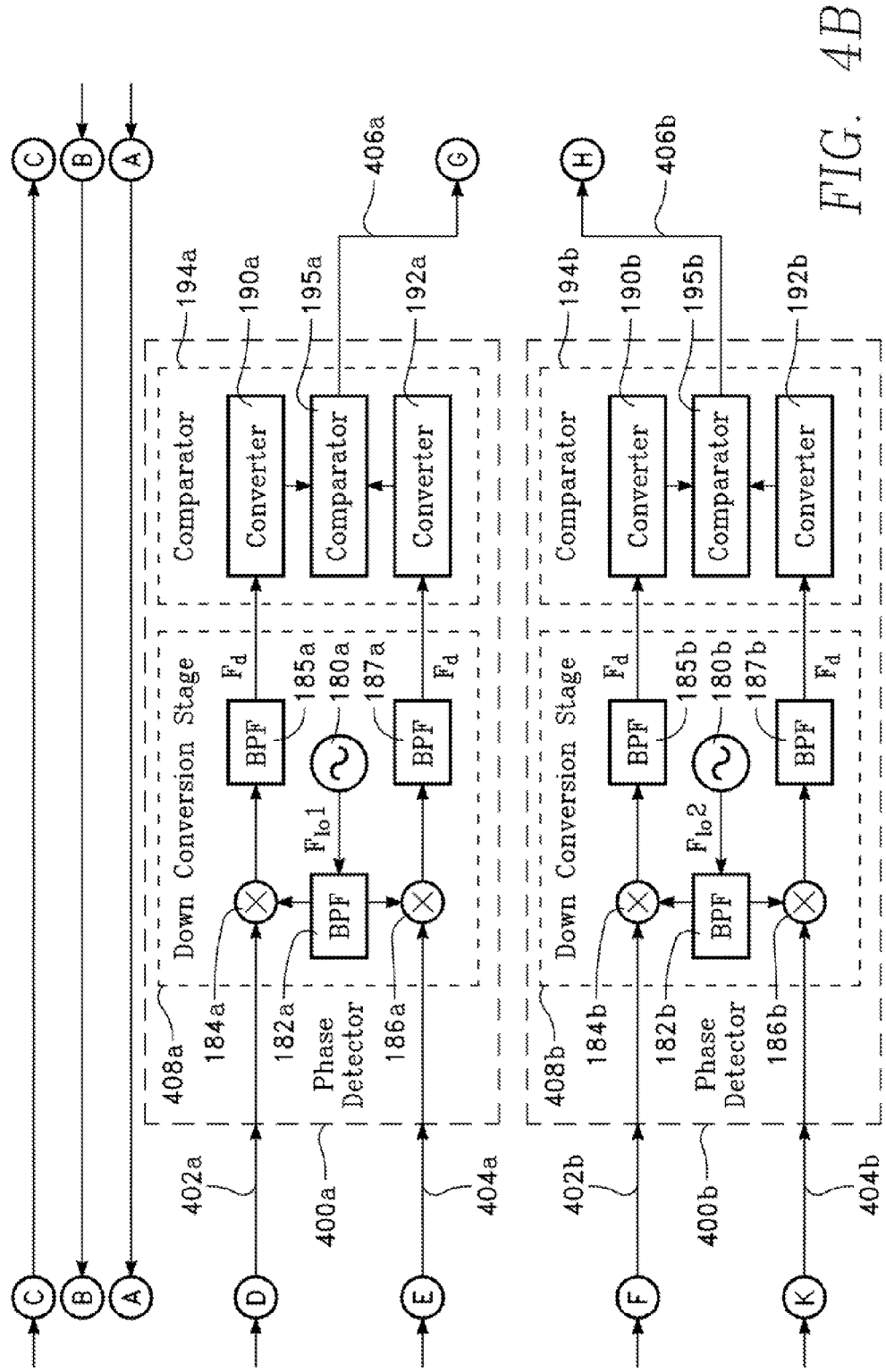
Figure 4C:
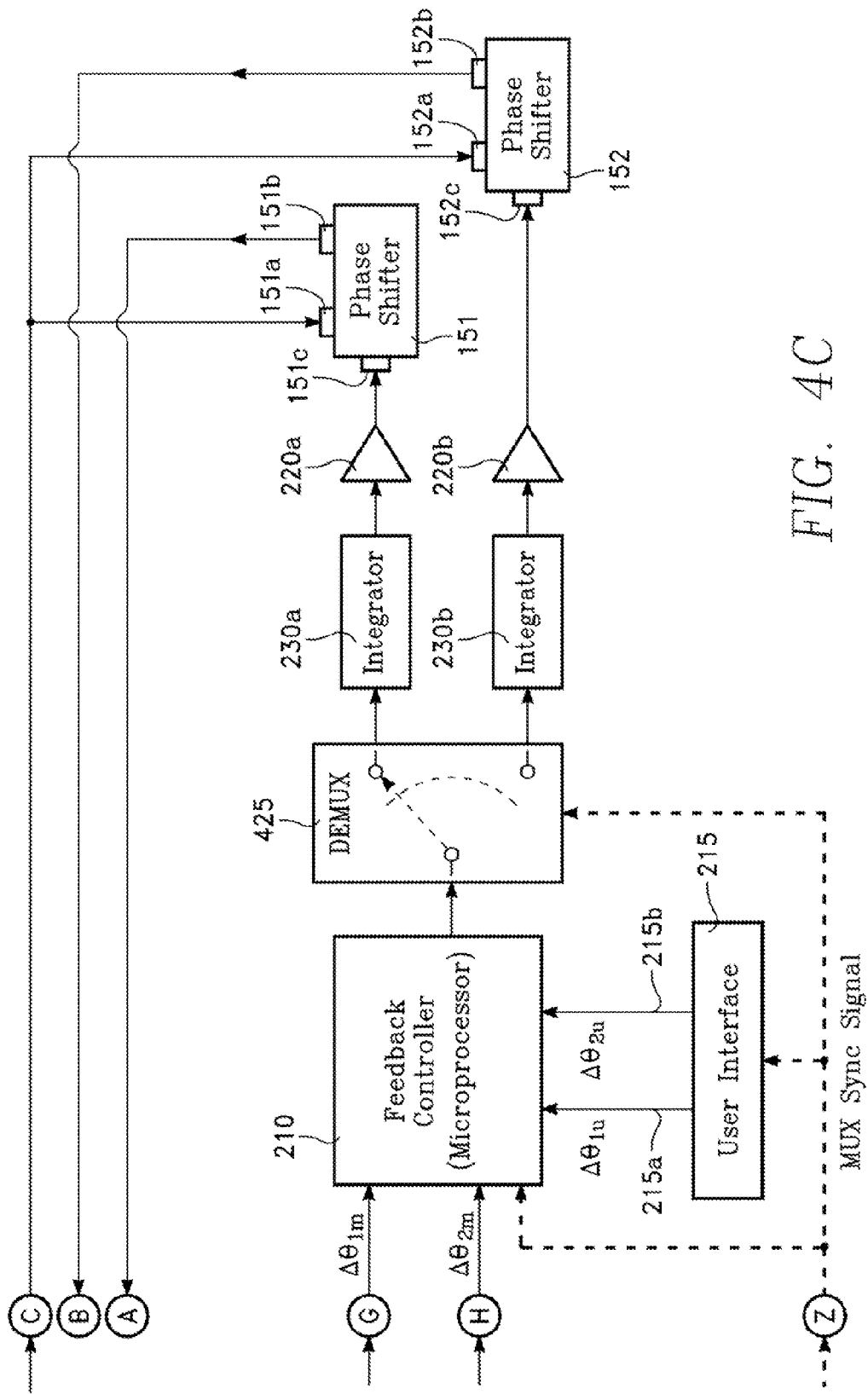

FIGS. 4A, 4B and 4C depict a modification of the embodiment of FIGS. 1A, 1B and 1C, in which a single feedback controller 210 is shared between the two independent feedback control loops using time-division multiplexing. The outputs of the respective sensor probe pairs (e.g., the probe pair 160a, 160c and the probe pair 160b, 160c) are enabled in different time windows by a multiplexer 420 so that the phase detectors 400a and 400b produce output signals during alternate time windows. The user interface outputs 215a and 215b (defining the user-selected phases of the inner and middle coil antennas 160a and 160b, respectively) are likewise controlled in synchronization with the multiplexer 420, so as to be enabled during the alternate time windows. During alternate time intervals, the feedback controller 210 responds to alternate ones of the phase detectors 400a, 400b and alternate ones of the user interface outputs 215a, 215b. The feedback controller 210, through a demultiplexer 425, applies corresponding error signals to alternate ones of the phase shifters 151, 152 during the alternate time windows. The respective outputs of the demultiplexer 425 may be coupled to the respective phase shifter control inputs 151c and 152c through respective integrators 230a and 230b and through respective operational amplifiers 220a and 220b.

In the embodiment of FIGS. 1A, 1B and 1C, there are two feedback controllers 210a and 210b, while in the embodiment of FIGS. 4A, 4B and 4C there is a single feedback controller 210. The pair of feedback controllers 210a and 210b of FIGS. 1A, 1B and 1C and the single feedback controller 210 of FIGS. 4A, 4B and 4C may be referred to genetically as a feedback controller stage.

While the foregoing is directed to embodiments of the present invention, other and further embodiments of the invention may be devised without departing from the basic scope thereof, and the scope thereof is determined by the claims that follow.

What is claimed is:

1. A plasma reactor for processing a workpiece, comprising:
 a vacuum chamber comprising a ceiling and a side wall, a workpiece support pedestal in said chamber having a workpiece support surface, and plural coil antennas;
 plural impedance matches and plural RF power amplifiers coupled to respective ones of said plural coil antennas through respective ones of said plural impedance matches, one of said plural RF amplifiers being a reference RF amplifier;
 a clock signal source coupled to said reference RF power amplifier, and respective phase shifters coupled between said clock signal source and at least respective ones of the RF power amplifiers other than said reference RF amplifier, each of said phase shifter having a phase shifter control input;

plural RF sensor probes, respective ones of the plural RF sensor probes coupled or adjacent to respective ones of said plural RF coil antennas, one of said RF sensor probes being a reference RF sensor probe;

respective phase detectors each having a phase detector output and a respective pair of phase detector inputs, one phase detector input in each of said respective pair of phase detector inputs being coupled to a respective one of said plural RF sensor probes other than the reference RF sensor probe, the other phase detector input in each of said respective pair of phase detector inputs being coupled to said reference RF sensor probe;

a user interface having a plurality of user interface outputs defining a user-selected phase difference between said reference RF sensor probe and a respective one of the remaining RF sensor probes; and a feedback controller stage coupled to (a) respective ones of said phase detector outputs and (b) respective ones of said user interface outputs, said feedback controller stage further comprising respective controller outputs coupled to respective ones of said phase shifter control inputs.

2. The reactor of claim 1 wherein said feedback controller stage comprises a pair of respective feedback controllers having respective pairs of inputs coupled to (a) a respective one of said phase detector outputs and (b) a respective one of said user interface outputs, each of said respective feedback controllers comprising a respective one of said respective controller outputs.

3. The reactor of claim 1 wherein said feedback controller stage comprises a single feedback controller, said reactor further comprising a multiplexer for causing respective ones of said phase detector outputs and respective ones of said user interface outputs to reach said single feedback controller during respective time windows, and a demultiplexer coupled between an output of said single feedback controller and respective ones of said phase shifter control inputs.

4. The reactor of claim 1 wherein each said phase detector comprises:
a frequency down conversion stage having respective inputs coupled to said RF sensor probes and respective outputs; and
a phase comparator having an output and a pair of inputs coupled to the respective outputs of said frequency down conversion stage.

5. The reactor of claim 1 further comprising an integrator coupled between said controller stage and said phase shifter control input.

6. The reactor of claim 5 wherein:
said feedback controller stage is adapted to produce successive correction signals;
said integrator is adapted to provide to said phase shifter control input an average over n of the previous successive correction signals.

7. The reactor of claim 6 wherein n is an integer in a range up to 5.

8. The reactor of claim 6 wherein n is an integer in a range up to 100.

9. The reactor of claim 6 wherein n is an integer in a range up to 1000.

10. The reactor of claim 6 wherein said successive correction signals correspond to a sampling period T, and wherein T is less than a settling time of one of said impedance matches by a factor greater than 10.

11. The reactor of claim 4 wherein each of said phase comparators comprises:
respective sine wave-to-square wave converters coupled to said respective outputs of said frequency down conversion stage;
a phase lock loop phase comparator coupled to said respective sine wave-to-square wave converters.

12. The reactor of claim 4 wherein said phase comparator comprises an IQ demodulator.

13. The reactor of claim 1 wherein said workpiece support comprises an electrostatic chuck (ESC), said ESC comprising an insulating puck layer having a top surface for supporting a workpiece, an ESC electrode embedded in said insulating puck layer, and a D.C. chucking voltage supply coupled to said ESC electrode.

14. The reactor of claim 1 wherein said plural coil antennas comprise plural helically wound conductors in respective cylindrical solenoids.

15. The reactor of claim 14 wherein each one of said plural helically wound conductors comprises plural parallel interleaved conductors.

16. The reactor of claim 14 wherein said respective cylindrical solenoids comprise inner and intermediate solenoids overlying said ceiling and an outer solenoid below said ceiling and surrounding a portion of said side wall.

17. The reactor of claim 1 wherein said coil antennas each comprise respective conductors concentrically wound in flat spirals.

* * * * *